US012581888B2

(12) United States Patent de Guzman et al.

(10) Patent No.: US 12,581,888 B2

(45) Date of Patent: Mar. 17, 2026

(54) SINGULATED SEMICONDUCTOR DEVICE INCLUDING A LAYER MODIFICATION OFFSET FROM A CORNER THEREOF AND METHODS FOR FORMING THE SAME

(71) Applicant: Micron Technology, Inc., Boise, ID (US)

(72) Inventors: Marc Anthony Romana de Guzman, Singapore (SG); Aibin Yu, Singapore (SG); Bee Sei Soh, Singapore (SG)

(73) Assignee: Micron Technology, Inc., Boise, ID (US)

( * ) Notice: Subject to any disclaimer, the term of this patent is extended or adjusted under 35 U.S.C. 154(b) by 375 days.

(21) Appl. No.: 18/140,523

(22) Filed: Apr. 27, 2023

(65) Prior Publication Data

US 2023/0395430 A1 Dec. 7, 2023

Related U.S. Application Data

(60) Provisional application No. 63/347,937, filed on Jun. 1, 2022.

(51) Int. Cl.
*H01L 21/78* (2006.01)
*H10D 62/10* (2025.01)

(52) U.S. Cl.
CPC .......... *H01L 21/78* (2013.01); *H10D 62/117* (2025.01)

(58) Field of Classification Search
CPC .............................. H01L 21/78; H10D 62/117
USPC .......................................................... 257/620
See application file for complete search history.

(56) References Cited

FOREIGN PATENT DOCUMENTS

| | | | | | |
|---|---|---|---|---|---|
| CN | 112640048 A | * | 1/2021 | .......... | H10D 62/405 |
| TW | 1733919 B | * | 7/2021 | | |

* cited by examiner

*Primary Examiner* — Phuc T Dang
(74) *Attorney, Agent, or Firm* — Dorsey & Whitney LLP

(57) ABSTRACT

A semiconductor device can include a semiconductor substrate singulated from a device wafer having had multiple semiconductor devices formed thereon. The semiconductor substrate can include a first corner, a first sidewall extends in a first direction from the first corner, and a second sidewall extending in a second direction from the first corner. The first sidewall can include a first laser modification extending along the first direction and the second sidewall can include a second laser modification extending along the second direction. A portion of the second sidewall between the first corner and the second laser modification can (i) exclude laser modification, or (ii) the second laser modification can be offset from the first corner along the second direction.

20 Claims, 6 Drawing Sheets

200

200

202

210

212

204    208    206

300a

304a

302

306a

300b

304b

302

306b

300c

304c

302

306c

300

406a

402

302

404a

300

402

406b

302

404b

300

402

406c

302

404c

500

502

Provide a semiconductor device wafer.

504

Lase the device wafer along a first path.

506

Lase the wafer along a second path, wherein the second path intersects the first path.

508

Interrupt lasing along the second path a first distance from the intersection.

510

Resume lasing along the second path a second distance from the intersection.

SINGULATED SEMICONDUCTOR DEVICE INCLUDING A LAYER MODIFICATION OFFSET FROM A CORNER THEREOF AND METHODS FOR FORMING THE SAME

CROSS-REFERENCE TO RELATED APPLICATION(S)

The present application claims priority to U.S. Provisional Patent Application No. 63/347,937, filed Jun. 1, 2022, the disclosure of which is incorporated herein by reference in its entirety.

TECHNICAL FIELD

The present disclosure is generally related to singulated semiconductor devices and associated methods. In particular, the present technology relates to singulated semiconductor devices excluding a laser modification on a substrate sidewall.

BACKGROUND

Semiconductor devices are typically manufactured by arranging a plurality of devices in a grid pattern on a device wafer that has one or more layers. The devices are then separated from each other during a singulation process. The singulation process can be, for example, plasma dicing, laser stealth dicing, or mechanical cutting using a rotary blade. Using any of these methods can damage the devices by cracking an edge, corner, or sidewall where two or more adjacent devices are separated from one another. Physical damage sustained by the devices can lower or fully inhibit their performance, thereby reducing overall production yield of fully-functioning devices.

Figure 1:
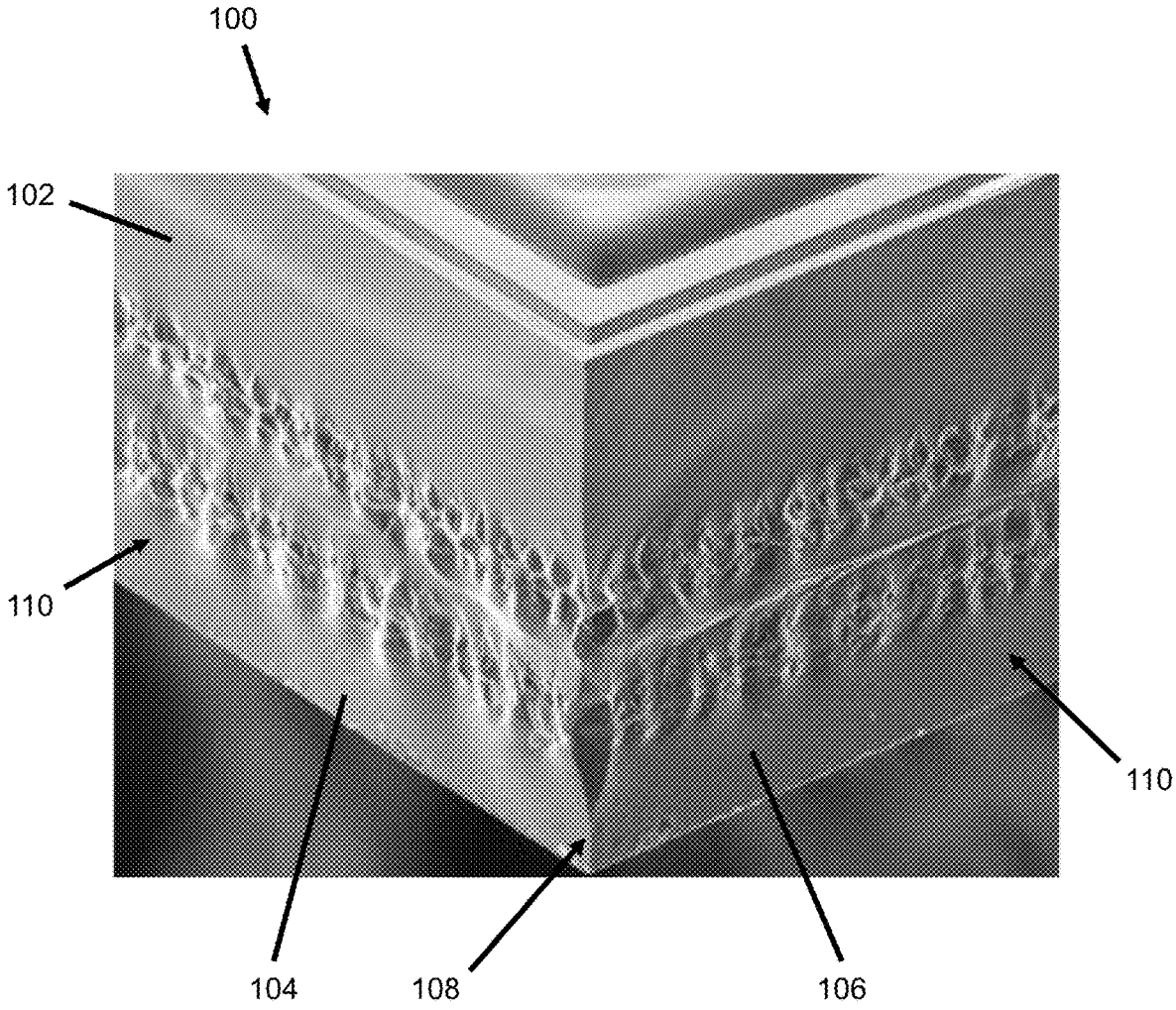
FIG. 1 is an image of a corner of a singulated semiconductor device.

The drawings have not necessarily been drawn to scale. Similarly, some components or operations can be separated into different components or combined into a single assembly for the purpose of discussion of some of the implementations of the present technology. Moreover, while the technology is amenable to various modifications and alternative forms, specific implementations have been shown by way of example in the drawings and are described in detail below.

DETAILED DESCRIPTION

One approach to semiconductor device singulation involves separating semiconductor devices formed on a semiconductor device wafer using laser stealth dicing and an expansion operation. After the devices are formed on the device wafer, the laser stealth dicing process can include using a continuously-activated or pulsed laser to selectively damage the wafer between formed devices. The device wafer can be selectively damaged internally, for example, along paths between the devices forming a grid pattern. The laser can selectively damage the wafer by using a laser beam at a certain wavelength emitted by the laser and by holding a head of the laser at a specified distance from the surface of the device wafer, condensing the beam at a set depth within the device wafer. These internal damages can weaken the device wafer along a plane in-line with the laser's path. Then, the device wafer can be expanded to singulate (e.g., separate) the devices along the planes, similar to pulling on the edges of perforated paper.

The present technology relates to singulated semiconductor devices and associated methods for the manufacture thereof, improving laser stealth dicing. For example, the present technology can include singulated semiconductor devices that exclude a laser modification on a substrate sidewall adjacent to a corner thereof. The absence of the laser modification adjacent to the corner of the semiconductor device can be achieved by selectively disengaging a stealth dicing tool (e.g., a laser) during device singulation to prevent the path of the stealth dicing tool from overlapping a path previously followed by the stealth dicing tool. By providing a semiconductor device sidewall without a laser modification adjacent to the corner of the substrate sidewall, damage sustained by the semiconductor devices due to singulation can be reduced, leading to a greater production yield of fully-functioning semiconductor devices.

In some embodiments, the singulated semiconductor devices can include a semiconductor substrate singulated from a device wafer having had multiple semiconductor devices formed thereon. The semiconductor substrate can include a first corner, a first sidewall extends in a first direction from the first corner, and a second sidewall extending in a second direction from the first corner. The first sidewall can include a first laser modification extending along the first direction and the second sidewall can include a second laser modification extending along the second direction. A portion of the second sidewall between the first corner and the second laser modification can (i) exclude laser modification, or (ii) the second laser modification can be offset from the first corner along the second direction.

The semiconductor device can be prepared for singulation by first providing a semiconductor device wafer including at least a first, a second, a third, and a fourth semiconductor device thereon. The semiconductor device wafer can be laser stealth diced along a first path and a second path, the second path intersecting the first path. The first path can separate the first and the second semiconductor devices from the third and the fourth semiconductor device, and the second path can separate the second and the third semiconductor devices from the first and the fourth semiconductor devices. When the semiconductor device wafer is laser stealth diced along the second path, the laser can be interrupted a first distance from the intersection with the first path and resumed a second distance from the intersection with the first path. After laser stealth dicing, an expansion force can be applied to the semiconductor device wafer to separate (e.g., singulate) the semiconductor devices.

For ease of reference, the semiconductor device, the laser modifications, and other components are sometimes described herein with reference to top, bottom, top, or bottom relative to the spatial orientation of the embodiments shown in the figures. It is to be understood, however, that the semiconductor devices and the modifications therein can be moved to, and used in, different spatial orientations without changing the structure and/or function of the disclosed embodiments of the present technology.

FIG. 1 is an image of a corner of a singulated semiconductor device 100 ("device 100") known in the art. As shown, the device 100 is one of many semiconductor devices singulated using a laser stealth dicing process from a larger device wafer having had multiple semiconductor devices formed thereon. The device 100 includes a semiconductor substrate 102 with an exposed first sidewall 104 and an exposed second sidewall 106 (the "sidewalls 104, 106"), each on opposite sides of a device corner 108 and extending along respective sides of the device 100. The first sidewall 104 can correspond with a first path and the second sidewall 106 can correspond with a second path followed by a laser during the stealth dicing process. A plane at the surface of each sidewall 104, 106 can correspond with the weakened plane generated by the laser along the first and second paths, respectively, during the laser stealth dicing process. Further, each sidewall 104, 106 includes a laser modification 110 (e.g., laser scarring, laser damage, or other laser artifacts evidenced by structural changes to the substrate caused by the laser) corresponding with the focal point depths of the laser during stealth dicing.

As shown, the laser modifications 110 on each sidewall 104, 106 include two lines corresponding to two different laser beam focal point depths extending from the corner 108 along the sides of the device 100. The laser modifications 110 indicate that, during laser stealth dicing, the laser was active (e.g., engaged) at the intersection of the first and the second laser paths during dicing along both paths because the laser modifications 110 extend all the way to the corner 108. When an active laser passes through a previously formed laser modification (e.g., when active laser paths intersect, such as when an active laser follows the second path and passes through the previously formed laser modification along the first path, stresses generated within the device wafer (e.g., the semiconductor substrate 102 before singulation) can be nonuniform or unpredictable. These stress abnormalities can lead to unintended device 100 damage during singulation. For example, when the device wafer is expanded to separate the devices 100, these abnormal stresses can be released, generating internal or external cracking or chipping along the corner 108, the sidewalls 104, 106, or other surfaces or edges of the device 100. Damaged devices 100 can lead to lower production yields and greater numbers of nonoperational or diminished capacity devices 100.

Figure 2:
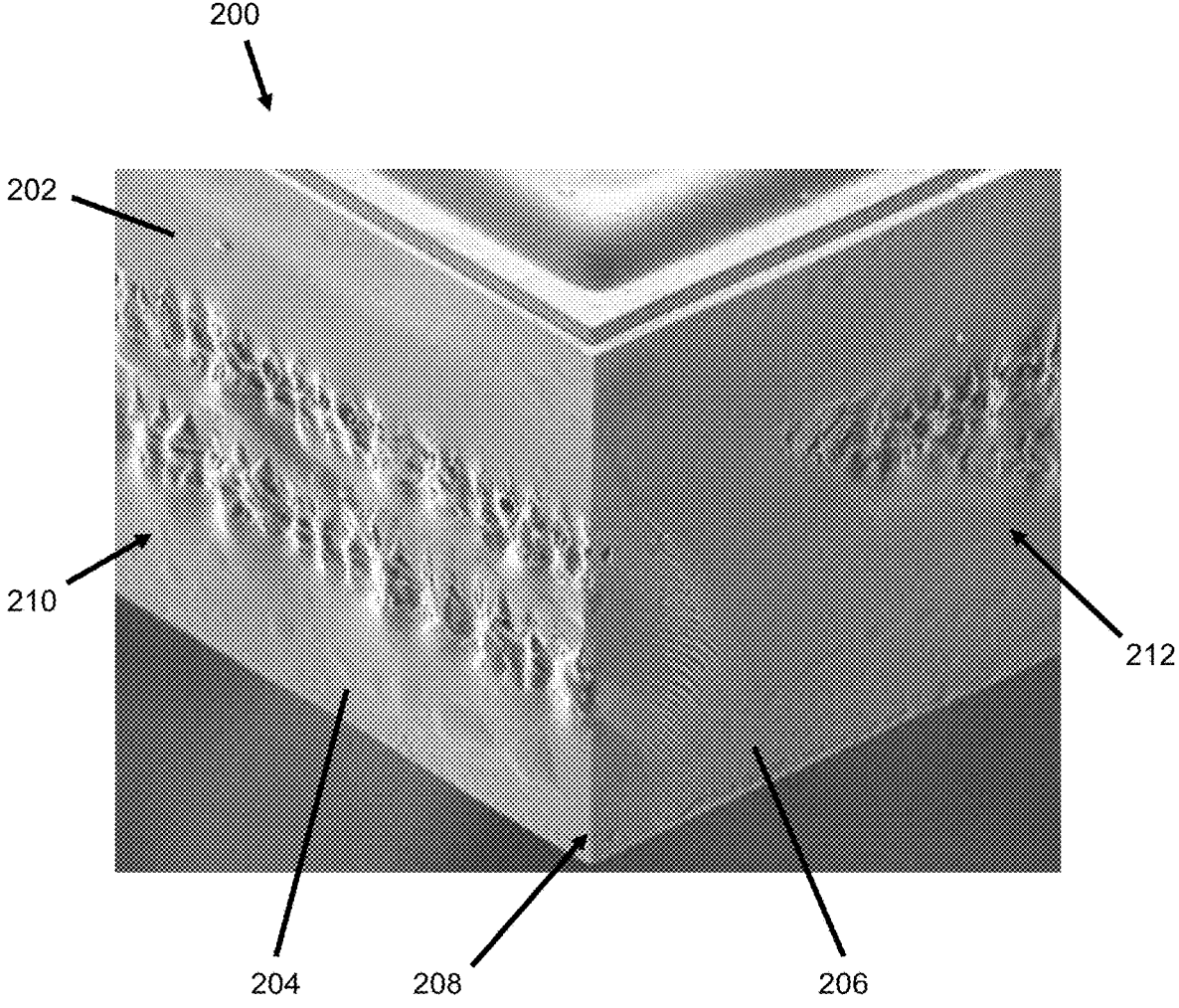
FIG. 2 is an image of a corner of a singulated semiconductor device, configured in accordance with embodiments of the present technology.

FIG. 2 is an image of a corner of a singulated semiconductor device 200 ("device 200") configured in accordance with embodiments of the present technology. As shown, the device 200 is one of many semiconductor devices singulated using a laser stealth dicing process from a larger device wafer having had multiple semiconductor devices formed thereon. The device 200 can include a semiconductor substrate 202 with an exposed first sidewall 204 and an exposed second sidewall 206 (the "sidewalls 204, 206"), each on opposite sides of a device corner 208 and extending along respective sides of the device 200. The first sidewall 204 can correspond with a first path and the second sidewall 206 can correspond with a second path followed by a laser during the stealth dicing processing. A plane at the surface of each sidewall 204, 206 can correspond with the weakened plane generated by the laser along the first and second paths, respectively, during the laser stealth dicing process. The sidewall 204 can include a laser modification 210 (e.g., laser scarring, laser damage, or other laser artifacts evidenced by structural changes to the substrate caused by the laser) and the sidewall 206 can include laser modification 212. Each laser modification can be generated by and correspond with the focal point depths of the laser during stealth dicing.

As shown, the laser modification 210 can include two lines corresponding to two different laser beam focal point depths extending from the corner 208 along the side of the device 200 (e.g., sidewall 204). The laser modification 212 similarly can include two beam focal point depths extending along the side of the device 200 (e.g., sidewall 206), however, a portion of the sidewall 206 between the corner 208 and the laser modification 212 can exclude (e.g., be completely or substantially free from) a laser modification generated by the laser along the second path. The laser modification 210 indicates that, during laser stealth dicing, the laser was active at the intersection of the first and second laser paths during dicing along the first path because the laser modification 210 extends all the way to the corner 208 and along the sidewall 204. The laser modification 212 indicates that, during laser stealth dicing, the laser was not active (e.g., disrupted, disengaged, paused, occluded, obstructed, powered down, etc.) at the intersection of the first and the second paths during dicing along the second path because a portion of the sidewall 206, corresponding to the beam focal point depth and between the corner 208 and the laser modification 212, excludes any laser modification generated by the laser along the second path. That is, for example, an end of the laser modification 212 nearest the corner 208 does not contact the corner 208. By deactivating the laser along the second laser path at the intersection of the first and the second paths during laser stealth dicing, an active laser does not pass through or proximate to (e.g., close enough for the physical effects of the second laser path to compound with those of the first laser path) a previously formed laser modification. By excluding overlapping or proximate laser modifications, the likelihood of nonuniform, unpredictable, or otherwise abnormal stresses within semiconductor substrate 202 is significantly reduced. Further, weakness in the device wafer created by the laser modifications 210, 212 remains within the weakened plane. Therefore, when the device wafer is singulated, (i) device 200 damage due to internal or external cracking or chipping along the corner 208, the sidewalls 204, 206, or other surfaces or edges of the device 200 is reduced, (ii) the sidewalls 204, 206 are more planar (e.g., flat) at and near the corner 208, providing uniform device 200 corners, and sharp or jagged edges or other protrusions from the corner 208 are reduced, and (iii) production yields of devices 200 are higher.

Figure 3A:
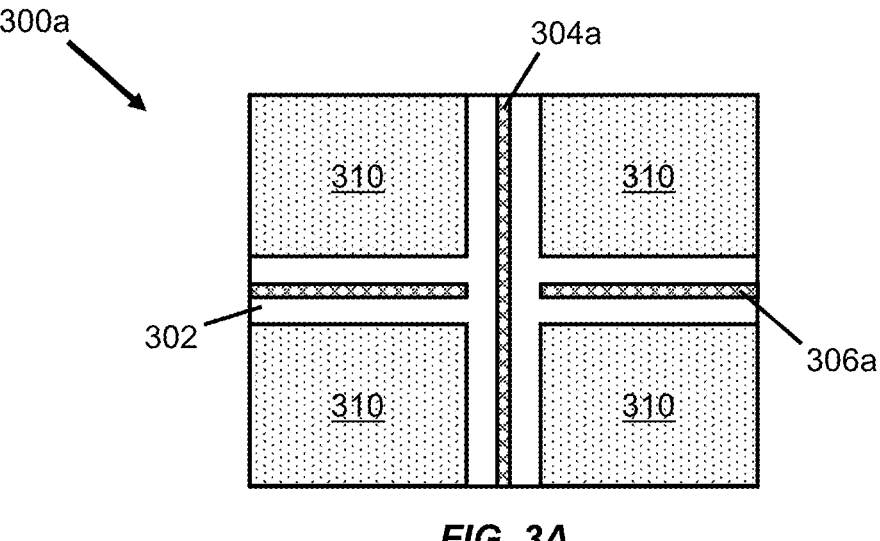
FIGS. 3A-3C are cross section, top schematic views of device wafer laser stealth dicing patterns for singulating semiconductor devices, in accordance with embodiments of the present technology.
Figure 3B:
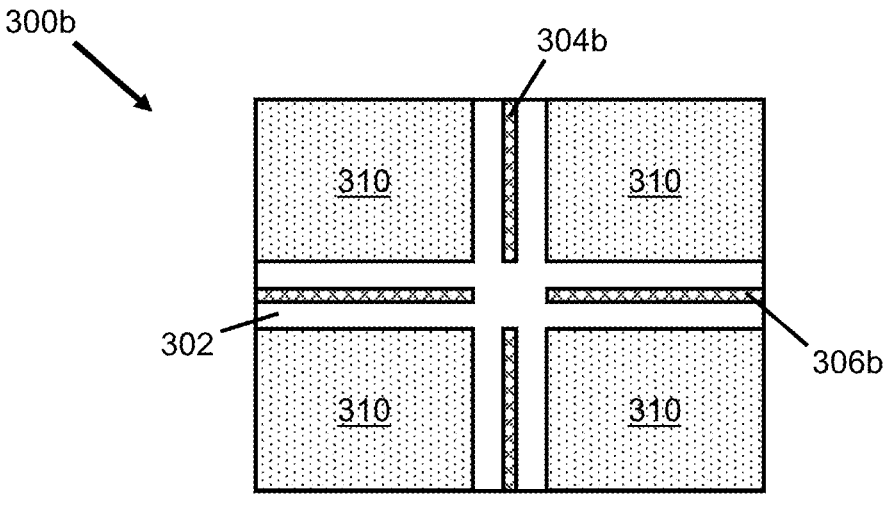
Figure 3C:
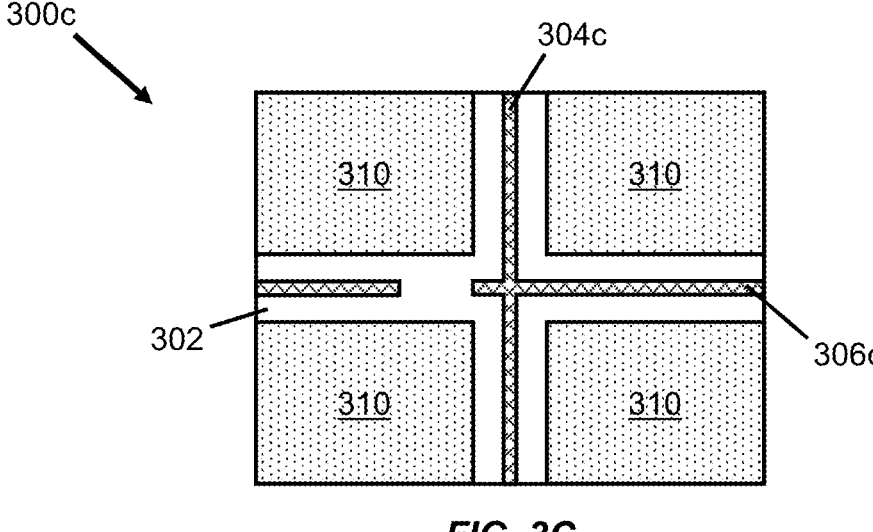

FIGS. 3A-3C are cross section, top schematic views of wafer laser stealth dicing patterns for singulating semiconductor devices 310 ("devices 310") from a device wafer 300 (identified individually as device wafers 300a-300c, respectively), configured in accordance with embodiments of the present technology. FIGS. 3A-3C illustrate the cross section of the device wafer 300 at a plane therein having laser modifications. The semiconductor devices 310 can correspond with some, similar, or all elements of the semiconductor device 200. Further, the singulating patterns of FIGS. 3A-3C and other patterns described can provide the same or similar benefits as identified regarding the semiconductor device 200. FIGS. 3A-3C illustrate three different partial schematic plan views of four adjacent devices 310 formed on a device wafer substrate 302, with each device 310 separated from adjacent devices 310 by a portion of unmodified device wafer 300. As shown, the unmodified portions of the device wafer 300 intersect at a central point between the four devices 310.

The devices 310 can be prepared for singulation using laser stealth dicing following the patterns illustrated in FIGS. 3A-3C. For example, a laser can generate a first laser modification 304 (identified individually as first laser modifications 304a-304c, respectively) along a first laser stealth dicing path. The laser can also generate a second laser modification 306 (identified individually as second laser modifications 306a-306c, respectively) along a second laser stealth dicing path. The first laser modification 304 and the second laser modification 306 can have one or more portions along the first path and the second path, respectively. The one or more portions can be at the surface of the device wafer 300 (e.g., at a top surface) or at one or more depths within the device wafer 300. A continuously-engaged or pulsed laser can generate each portion following the first path or the second path in one or more cycles (e.g., the laser can take multiple passes along the first path or the second path at a same depth or at different depths).

In some embodiments, the device wafer 300 can include more than four devices 310, and can include additional intersections of unmodified device wafer 300 portions therebetween. In these embodiments, the same or different laser stealth dicing patterns can be used for generating laser modifications at each intersection. By following one of the laser stealth dicing patterns illustrated in FIGS. 3A-3C or otherwise described, nonuniform, unpredictable, or otherwise abnormal stresses within the wafer substrate 302 can be managed, limited, or eliminated near or at the laser modifications 304, 306. Internal or external cracking or chipping along a corner, a sidewall, or other surfaces or edges of the singulated devices 310 can therefore be reduced or eliminated, reducing the needed width for portions of unmodified device wafer 302 between adjacent devices 310, thereby leading to greater device 310 production yields.

FIG. 3A illustrates a laser stealth dicing pattern for singulating semiconductor devices 310 from the device wafer 300a, including the first laser modification 304a and the second laser modification 306a. As illustrated, the first laser modification 304a includes a single portion extending along the first path, including extending across the intersection of the first path and the second path. The second laser modification 306a includes a first portion and a second portion extending along the second path, and a gap therebetween at the intersection of the first path and the second path. An end of the first portion and an end of the second portion can each be separated from the intersection by the same or different distances, creating the gap. For example, the end of the first portion or the end of the second portion can each be separated from the intersection by 5 um, 10 um, 20 um, 40 um, 60 um, 80 um, 100 um, 120 um, 140 um, 160 um, 180 um, 200 um, or any incremental distance therebetween or greater than 180 um. The distance by which the end of each portion is separated from the intersection can, in some embodiments, correspond to a radius or a height of a laser artifact caused by the laser used to stealth dice the device wafer 300a (e.g., ½ the laser artifact radius or height, 1× the laser artifact radius or height, 2×, 3×, 4×, 5×, 10×, etc.). In some embodiments, the radius or the height of the laser artifact can correspond with a separation distance between a head of the laser and the surface of the device wafer 300b, and therefore the separation distance from the end of each portion to the intersection can correspond with the distance between the laser head and the device wafer 300b. In some embodiments, the separation distance from the end of each portion to the intersection can correspond with the distance between the laser head and the device wafer 300b, regardless of the laser artifact height or radius.

FIG. 3B illustrates a laser stealth dicing pattern for singulating semiconductor devices 310 from the device wafer 300b, including the first laser modification 304b and the second laser modification 306b. As illustrated, the first laser modification 304b includes a first portion and a second portion extending along the first path, and a gap therebetween at the intersection of the first path and the second path. The second laser modification 306b includes a first portion and a second portion extending along the second path, and a gap therebetween at the first and second path intersection. An end of all four portions can each be separated from the intersection by the same or different distances, creating gaps along the first and second paths, respectively. For example, the end of the first and second portions of the first laser modification 304b and the end of the first and second portions of the second laser modification 306b can each be separated from the intersection by 5 um, 10 um, 20 um, 40 um, 60 um, 80 um, 100 um, 120 um, 140 um, 160 um, 180 um, 200 um, or any incremental distance therebetween or greater than 180 um. The distance by which the end of each portion is separated from the intersection can, in some embodiments, correspond to a radius or a height of a laser artifact caused by the laser used to stealth dice the device wafer 300b (e.g., ½ the laser artifact radius or height, 1× the laser artifact radius, 2×, 3×, 4×, 5×, 10×, etc.). In some embodiments, the radius or the height of the laser artifact can correspond with a separation distance between a head of the laser and the surface of the device wafer 300b, and therefore the separation distance from the end of each portion to the intersection can correspond with the distance between the laser head and the device wafer 300b. In some embodiments, the separation distance from the end of each portion to the intersection can correspond with the distance between the laser head and the device wafer 300b, regardless of the laser artifact height or radius.

FIG. 3C illustrates a laser stealth dicing pattern for singulating semiconductor devices 310 from the device wafer 300c, including the first laser modification 304c and the second laser modification 306c. As illustrated, the first laser modification 304c includes a single portion extending along the first path, including extending across the intersection of the first path and the second path. The second laser modification 306c includes a first portion and a second portion extending along the second path and with a gap therebetween. The second portion can extend across the intersection and the gap can be offset from the first path. For example, an end of the second portion can extend across the first path (e.g., offsetting the gap from the first path) 5 um, 10 um, 20 um, 40 um, 60 um, 80 um, 100 um, 120 um, 140 um, 160 um, 180 um, 200 um, or any incremental distance therebetween or greater than 180 um. The end of the first portion and an end of the second portion can be separated from one another along the second path (e.g., creating the gap) by 10 um, 50 um, 100 um, 150 um, 200 um, 250 um, 300 um, 350 um, 400 um, or any incremental distance therebetween or greater than 400 um. The gap between the ends of the second laser modification 306c portions can, in some embodiments, correspond to a radius or a height of a laser artifact caused by the laser used to stealth dice the device wafer 300c (e.g., ½ the laser artifact radius or height, 1× the laser artifact radius, 2×, 3×, 4×, 5×, 10×, etc.). In some embodiments, the radius or the height of the laser artifact can correspond with a separation distance between a head of the laser and the surface of the device wafer 300c, and therefore the gap can correspond in width with the distance between the laser head and the device wafer 300c. In some embodiments, the gap can correspond with the distance between the laser head and the device wafer 300c, regardless of the laser artifact height or radius.

Figure 4A:
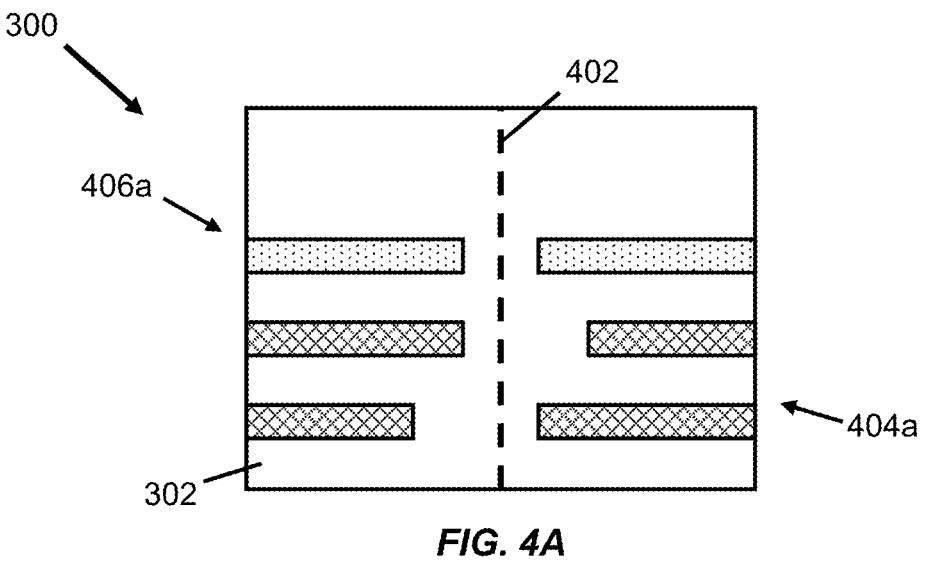
FIGS. 4A-4C are cross section, side schematic views of device wafer laser stealth dicing patterns for singulating semiconductor devices, in accordance with embodiments of the present technology.
Figure 4B:
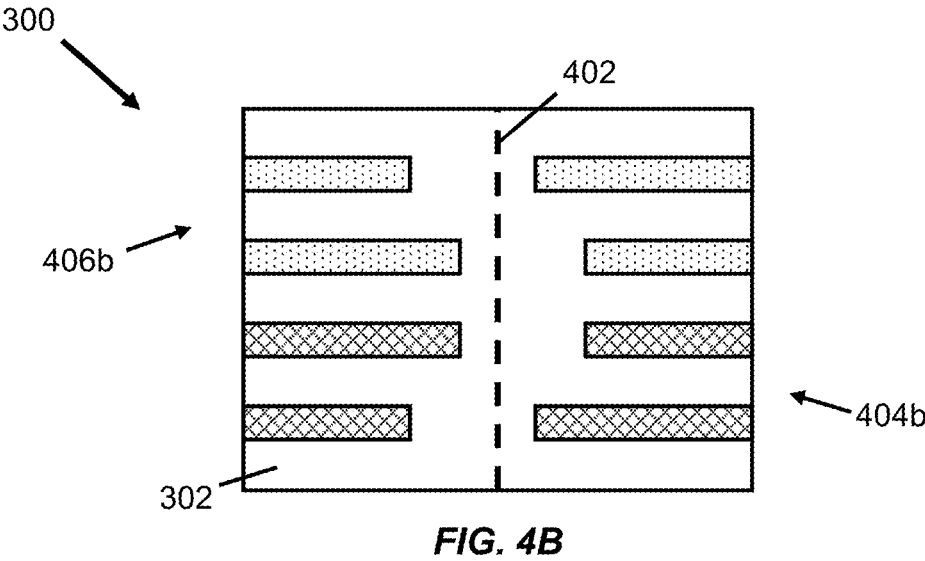
Figure 4C:
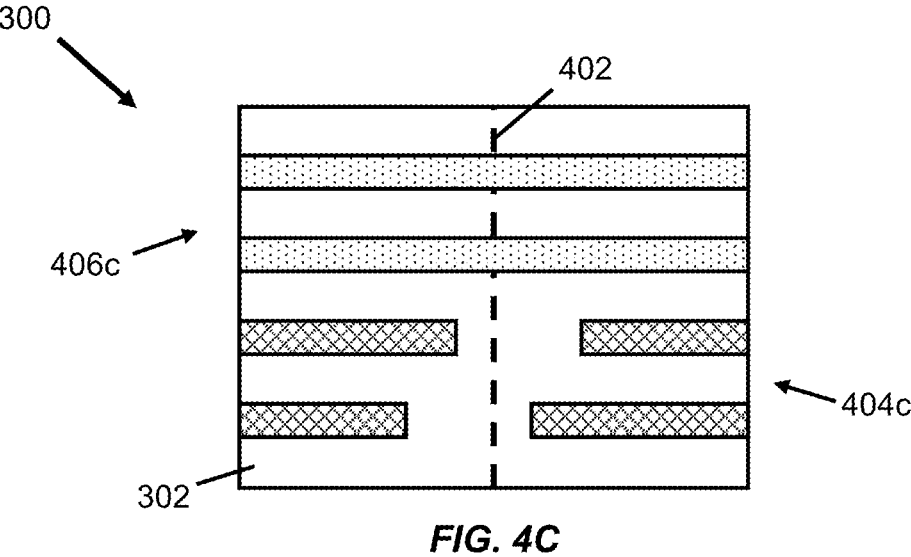

FIGS. 4A-4C are cross section, side schematic views of wafer laser stealth dicing patterns for singulating semiconductor devices (e.g., devices 310 of FIGS. 3A-3C) from the device wafer 300, configured in accordance with embodiments of the present technology. FIGS. 4A-4C illustrate the cross section of the device wafer 300 at the intersection of the first path and the second path, at the second path (e.g., at the plane followed by the laser along the second path). One or more of FIGS. 4A-4C illustrate the laser modifications 404, 406 (i) generated at multiple depths within substrate 302, (ii) generated using single or double beam lasers, and (iii) generated using multiple laser passes. The wafer substrate 302 includes the first path of the laser illustrated by a dashed line 402. Further, the dashed line 402 identifies the intersection of the first path and the second path. The wafer substrate 302 can include the second laser modification 306 having a first laser modification 404 (identified individually as first laser modifications 404a-404c in FIGS. 4A-4C, respectively) and having a second laser modification 406 (identified individually as second laser modifications 406a-406c in FIGS. 4A-4C, respectively) generated by the laser along the second path. In some embodiments, the first laser modification 304 can also have the first laser modification 404 or the second laser modification 406.

FIG. 4A illustrates a laser stealth dicing pattern for singulating semiconductor devices including the first laser modification 404a and the second laser modification 406a. As illustrated, the first laser modification 404a includes damage generated using a dual laser with a single pass. The first laser modification 404a can include a first portion generated on the left side of the intersection and a second portion generated on the right side of the intersection. The first and second portions each can include damage at a first depth and a second depth, above the first depth, within the wafer substrate 302. For example, the dual laser can be used along the second path with a single pass in one direction (e.g., once from the left to the right) with the dual laser disengaged at the intersection, generating the first and second portions. The second laser modification 406a can include damage generated using a single laser along the second path with a single pass (e.g., once from the left to the right or from the right to the left) and with the laser disengaged at the intersection. The second laser modification 406a includes a first portion generated on the left side of the intersection and a second portion generated on the right side of the intersection, each at a third depth, above the first and second depths, within the wafer substrate 302.

FIG. 4B illustrates a laser stealth dicing pattern for singulating semiconductor devices including the first laser modification 404b and the second laser modification 406b. As illustrated, the first laser modification 404b includes damage generated using a dual laser along the second path with two passes. The first laser modification 404b can include a first portion generated on the left side of the intersection and a second portion generated on the right side of the intersection. The first and second portions can each include damage at a first depth and a second depth, above the first depth, within the wafer substrate 302. For example, the dual laser can be used along the second path from the left to the right and stopped, or the laser disengaged, before the intersection. The dual laser can also be used along the second path from the right to the left and stopped, or the laser disengaged, before the intersection. The second laser modification 406b can include damage generated using a dual laser along the second path with a single pass. The second laser modification 406b can include a first portion generated on the left side of the intersection and a second portion generated on the right side of the intersection. The first and second portions can each include damage at a third depth, above the first and second depths, and a fourth depth, above the first, second, and third depths, within the wafer substrate 302. For example, the dual laser can be used along the second path with a single pass in one direction (e.g., from the right to the left) with the dual laser disengaged at the intersection.

FIG. 4C illustrates a laser stealth dicing pattern for singulating semiconductor devices including the first laser modification 404c and the second laser modification 406c. As illustrated, the first laser modification 404c of FIG. 4C can be the same as the first laser modification 404a of FIG. 4A. In FIG. 4C, the second laser modification 406c can include a single portion extending along the second path, including extending across the intersection, generated using a dual laser along the second path with one pass. For example, the dual laser can be used along the second path with a single pass in one direction (e.g., from the right to the left or from the left to the right) with the dual laser engaged throughout the pass. In some embodiments, the first laser modification 404c can instead correspond with the second laser modification 406c, as illustrated, and the second laser modification 406c can instead correspond with the first laser modification 404c. That is, for example, the first laser modification 404c can include a single portion extending along the second path and across the intersection at a depth within the wafer substrate 302 further from active structures on a top surface of the wafer substrate 302, and the second laser modification 406c can include two portions, neither of which extends across the intersection.

In some embodiments, one of the first laser modifications 404 from FIGS. 4A-4C can be used with one of the second laser modifications 406 of a non-corresponding Figure. For example, the first laser modification 404a of FIG. 4A can be used with the second laser modification 406c of FIG. 4C. In some embodiments, one of the first laser modification 404 can replace one of the second laser modification 406, or the second laser modification 406 can replace one of the first laser modifications 404. For example, the device wafer 300 can include the first laser modifications 404a of FIG. 4A and an additional first laser modification 404a of FIG. 4A replacing the second laser modification 406a. As a further example, the device wafer 300 can include the second laser modification 406a of FIG. 4A and an additional second laser modification 406a of FIG. 4A replacing the laser modification 404a. In some embodiments, the device wafer 300 can include only the first laser modification 404 or the second laser modification 406. Further, in some embodiments, the device wafer 300 can include one or more additional first laser modifications 404 or second laser modifications 406.

By following one of the laser stealth dicing patterns illustrated in FIGS. 4A-4C or otherwise described, nonuniform, unpredictable, or otherwise abnormal stresses within the wafer substrate 302 can be managed, limited, or eliminated near or at the laser modifications 404, 406. Internal or external cracking or chipping along a corner, a sidewall, or other surfaces or edges of the singulated devices 310 can therefore be reduced or eliminated, leading to greater device 310 production yields.

Figure 5:
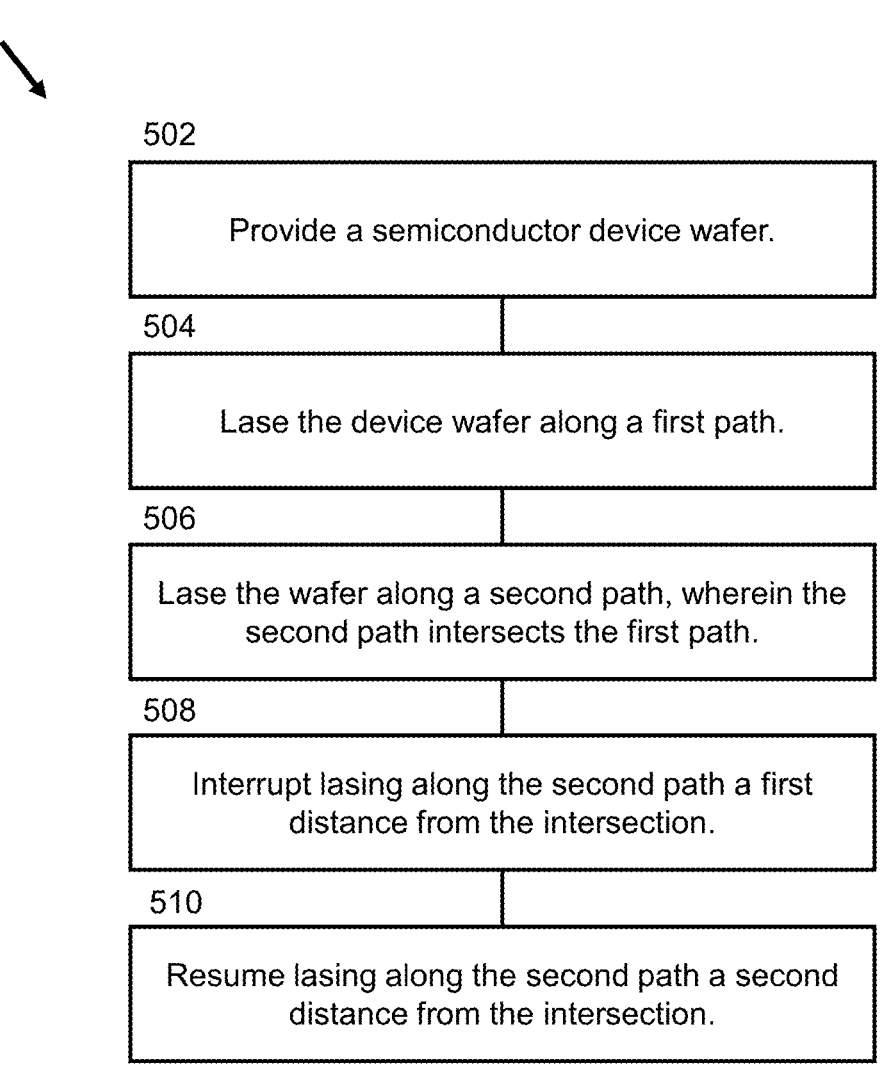
FIG. 5 is a flow diagram illustrating a method for preparing semiconductor devices for singulation using laser stealth dicing, in accordance with embodiments of the present technology.

FIG. 5 is a flow diagram illustrating a method 500 for preparing semiconductor devices for singulation, in accordance with embodiments of the present technology. The operations of method 500 are intended for illustrative purposes and are non-limiting. In some embodiments, the method 500 can be accomplished with one or more additional operations not described, without one or more operations described, or with the operations in an alternative order. As shown in FIG. 5, the method 500 can include: providing a semiconductor device wafer (method portion 502); laser stealth dicing (e.g., lasing) the device wafer along a first path (method portion 504); laser stealth dicing the device wafer along a second path, wherein the second path intersects the first path (method portion 506); interrupting (e.g., disengaging) laser stealth dicing along the second path a first distance from the intersection (method portion 508); and resuming (e.g., reengaging) laser stealth dicing along the second path a second distance from the intersection (method portion 510). Once the semiconductor devices are prepared for singulation, an expansion force can be applied to the device wafer, separating the semiconductor devices along the first and the second paths.

In method portion 502, the provided device wafer can include at least four semiconductor devices in a grid-like pattern on the device wafer arranged with two rows of two semiconductor devices. In method portion 504, a laser (e.g., a dual or a single laser) can be initiated (e.g., continuously engaged or pulsed) for laser stealth dicing the device wafer along the first path (e.g., from the top to the bottom or from the bottom to the top) to generate a first laser modification within the device wafer. The first path can separate a first column of semiconductor devices (e.g., a first and a second semiconductor devices) from a second column of semiconductor devices (e.g., a third and a fourth semiconductor devices). The generated first laser modification can correspond with the first laser modification 304 of FIGS. 3A-3C.

In method portion 506, the laser can be initiated for laser stealth dicing the device wafer along the second path (e.g., from the left to the right) to generate a first portion of a second laser modification within the device wafer. The second path can intersect the first path and can separate a first row of semiconductor devices (e.g., the first and the third semiconductor devices) from a second row of semiconductor devices (e.g., the second and the fourth semiconductor devices). The generated first portion of the second laser modification can correspond with the first portion of the second laser modification 306 of FIGS. 3A-3C and a portion of one of the laser modifications 404, 406 of FIGS. 4A-4C.

In method portion 508, laser stealth dicing along the second path can be disengaged a first distance from the intersection. For example, while a tool carrying the laser continues to follow the second path, or while the device wafer continues to move relative to the laser (e.g., when the tool is stationary), the laser can be disengaged 5 um, 10 um, 20 um, 40 um, 60 um, 80 um, 100 um, 120 um, 140 um, 160 um, 180 um, 200 um, or any incremental distance therebetween or greater than 180 um separated from the intersection. By disengaging the laser and continuing movement of the tool or the device wafer, an end of the first portion of the second laser modification is created. The laser can be disengaged at the first distance from the intersection either before or after passing the intersection. The laser can be disengaged by, for example, using Q-switching, disengaging the laser diode, or any similar method for temporarily pausing laser beam operation.

In method portion 510, laser stealth dicing along the second path can be reengaged a second distance from the intersection to generate a second portion of the second laser modification. For example, while continuing movement of the tool or the device wafer, the laser can be reengaged at the second distance from the intersection in the same, or the opposite, direction as first distance from the intersection. The second distance can be 5 um, 10 um, 20 um, 40 um, 60 um, 80 um, 100 um, 120 um, 140 um, 160 um, 180 um, 200 um, or any incremental distance therebetween or greater than 180 um. When the first portion of the second laser modification extends across the intersection, the second distance is greater than the first distance. When the first portion of the second laser modification does not extend across the intersection, the second distance can be either greater or smaller than the first distance. By reengaging the laser and continuing movement of the tool or the device wafer, an end of the second portion of the second laser modification is created. Further, a section of the device wafer along the second path is provided without laser modification (e.g., a laser modification gap). The gap can be at the intersection and, therefore, the device wafer can have only laser modification at the intersection along the first path.

After laser stealth dicing the device wafer along the first and the second paths, the semiconductor devices are prepared for singulation therefrom. The semiconductor devices can be singulated by providing an expanding force to the device wafer, separating the device wafer along the first and the second paths and creating at least four singulated semiconductor devices.

By following the method 500 of FIG. 5 or otherwise described, nonuniform, unpredictable, or otherwise abnormal stresses within the device wafer can be managed, limited, or eliminated near or at the first and second laser modifications. Internal or external cracking or chipping along a corner, a sidewall, or other surfaces or edges of the singulated semiconductor devices can therefore be reduced or eliminated, leading to greater semiconductor device production yields.

Figure 6:
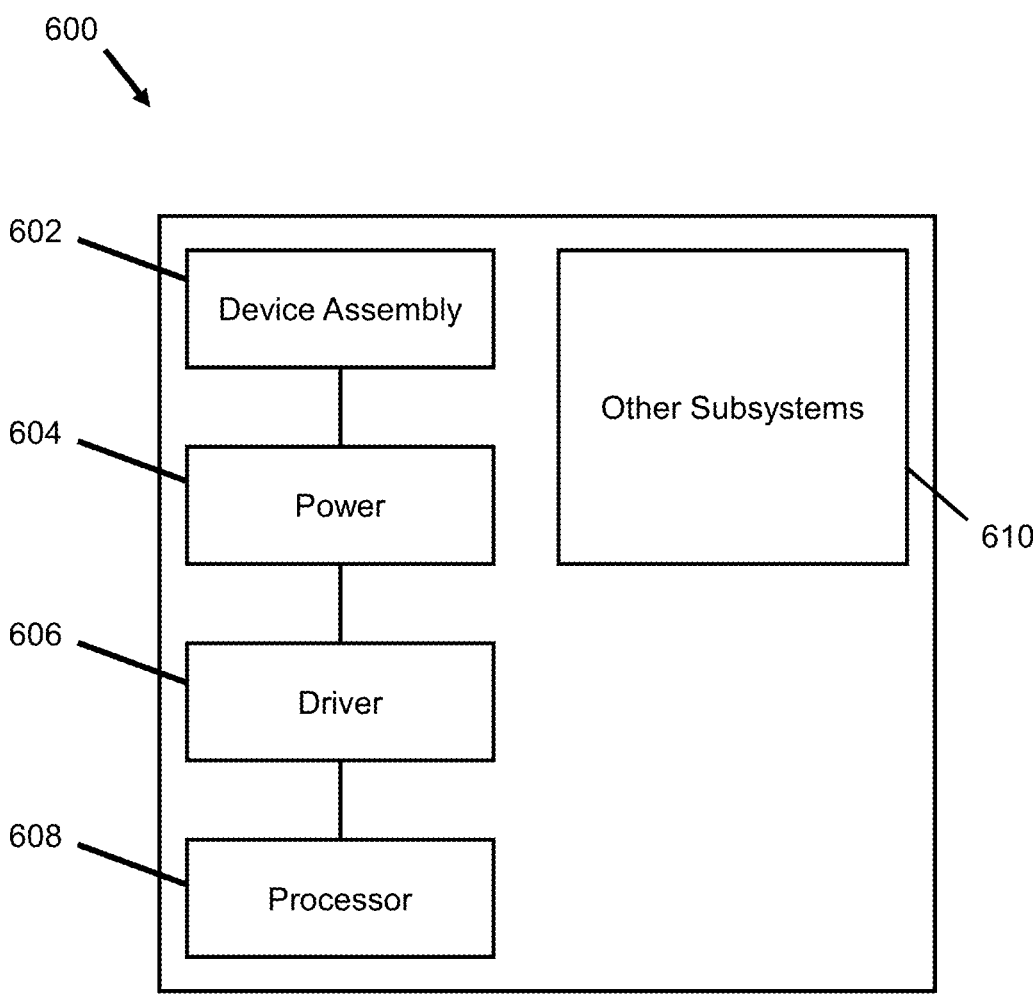
FIG. 6 is a schematic diagram illustrating semiconductor device assembly incorporating singulated semiconductor devices, configured in accordance with embodiments of the present technology.

Any one of the semiconductor devices and semiconductor device assemblies described above with reference to FIGS. 2-5 can be incorporated into any of a myriad of larger and/or more complex systems, a representative example of which is system 600 shown schematically in FIG. 6. The system 600 can include a semiconductor device assembly (e.g., or a discrete semiconductor device) 602, a power source 604, a driver 606, a processor 608, and/or other subsystems or components 610. The semiconductor device assembly 602 can include features generally similar to those of the semiconductor devices described above with reference to FIGS. 2-5. The resulting system 600 can perform any of a wide variety of functions, such as memory storage, data processing, or other suitable functions. Accordingly, representative systems 600 can include, without limitation, hand-held devices (e.g., mobile phones, tablets, digital readers, and digital audio players), computers, vehicles, appliances and other products. Components of the system 600 may be housed in a single unit or distributed over multiple, interconnected units (e.g., through a communications network).

The components of the system 600 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Additionally, the terms "comprising," "including," "having," and "with" are used throughout to mean including at least the recited feature(s) such that any greater number of the same features and/or additional types of other features are not precluded.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
a singulated semiconductor substrate including:
  a first corner, a first sidewall extending in a first direction from the first corner, the first sidewall including a first laser modification extending along the first direction, and
a second sidewall extending in a second direction from the first corner, the second sidewall including a second laser modification extending along the second direction, wherein a portion of the second sidewall between the first corner and the second laser modification excludes laser modification.

2. The semiconductor device of claim 1, wherein the singulated semiconductor device substrate further includes a second corner opposite the first corner along the second sidewall, and wherein the second sidewall includes a second portion between the second corner and the second laser modification excluding laser modification.

3. The semiconductor device of claim 1, wherein a portion of the first sidewall between the first corner and the first laser modification excludes laser modifications.

4. The semiconductor device of claim 1, wherein the second laser modification includes only a top laser modification and a bottom laser modification.

5. The semiconductor device of claim 4, wherein an end of the bottom laser modification is spaced further from the first corner than an end of the top laser modification is spaced from the first corner.

6. The semiconductor device of claim 4, wherein an end of the top laser modification is spaced further from the first corner than an end of the bottom laser modification is spaced from the first corner.

7. The semiconductor device of claim 1, wherein a width of the portion excluding laser modification along a second path corresponds with a height of one or more laser artifacts of the second laser modification.

8. The semiconductor device of claim 1, wherein a width of the portion excluding laser modification along a second path corresponds with a separation height between an upper surface of the semiconductor substrate and a laser tool head used to form the second laser modification.

9. The semiconductor device of claim 1, wherein a portion of a top surface of the singulated semiconductor device substrate adjacent to the first sidewall excludes a circuit formed thereon.

10. A semiconductor device, comprising:
a singulated semiconductor substrate including:
  a first corner,
  a first sidewall extending in a first direction from the first corner, the first sidewall including a first laser modification extending along the first direction, and
  a second sidewall extending in a second direction from the first corner, the second sidewall including a second laser modification offset from the first corner and extending along the second direction.

11. The semiconductor device of claim 10, wherein the singulated semiconductor device substrate further includes:
a second corner opposite the first corner along the second sidewall; and
a third sidewall extending in the first direction from the second corner, the third sidewall including a third laser modification extending in the first direction from the second corner.

12. The semiconductor device of claim 10, wherein the singulated semiconductor device substrate further includes:
a second corner opposite the first corner along the second sidewall; and
a third sidewall extending in the first direction from the second corner, the third sidewall including a third laser modification offset from the second corner and extending along the first direction.

13. The semiconductor device of claim 10, wherein the singulated semiconductor device substrate further includes a second corner opposite the first corner along the second sidewall, and wherein the second laser modification extends along the second direction to the second corner.

14. The semiconductor device of claim 10, wherein a portion of the first sidewall between the first corner and the first laser modification excludes laser modifications.

15. The semiconductor device of claim 10, wherein the second laser modification includes only a top laser modification and a bottom laser modification.

16. The semiconductor device of claim 10, wherein a distance between the first corner and the second laser modification along a second path corresponds with a height of one or more laser artifacts of the second laser modification.

17. The semiconductor device of claim 10, wherein the first laser modification, the second laser modification, or both the first laser modification and the second laser modification include multiple laser artifacts indicative of a pulsed laser during a laser stealth dicing process.

18. The semiconductor device of claim 10, wherein the first laser modification, the second laser modification, or both the first laser modification and the second laser modification include laser artifacts indicative of a continuously engaged laser during a laser stealth dicing process.

19. A method for stealth dicing a semiconductor device wafer, comprising:
   providing a semiconductor device wafer including a first, a second, a third, and a fourth semiconductor device;
   lasing the semiconductor device wafer along a first path, wherein the first path separates the first and the second semiconductor devices from the third and the fourth semiconductor devices;
   lasing the semiconductor device wafer along a second path, wherein the second path intersects the first path and separates the second and the third semiconductor devices from the first and the fourth semiconductor devices;
   interrupting the lasing of the semiconductor device wafer along the second path a first distance from the intersection with the first path; and
   resuming the lasing of the semiconductor device wafer along the second path a second distance from the intersection with the first path.

20. The method of claim 19 further comprising:
   applying an expansion force to the semiconductor device wafer to separate the first, second, third, and fourth semiconductor devices along the first and second paths.

* * * * *